United States Patent
Kimura (10) Patent No.: US 10,860,828 B2
(45) Date of Patent: Dec. 8, 2020

(54) BATTERY DEGRADATION AUTHENTICATION DEVICE AND BATTERY DEGRADATION AUTHENTICATION SYSTEM

(71) Applicant: TOYOTA JIDOSHA KABUSHIKI KAISHA, Toyota-shi (JP)

(72) Inventor: Kenji Kimura, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/674,125

(22) Filed: Nov. 5, 2019

(65) Prior Publication Data

US 2020/0160017 A1    May 21, 2020

(30) Foreign Application Priority Data

Nov. 21, 2018   (JP) .................................. 2018-218611

(51) Int. Cl.
*G06K 7/14* (2006.01)
*H01M 10/42* (2006.01)
*G01R 31/392* (2019.01)

(52) U.S. Cl.
CPC ......... *G06K 7/1417* (2013.01); *G01R 31/392* (2019.01); *H01M 10/425* (2013.01); *H01M 10/4285* (2013.01); *H01M 2010/4278* (2013.01); *H01M 2220/20* (2013.01)

(58) Field of Classification Search
None
See application file for complete search history.

(56) References Cited

U.S. PATENT DOCUMENTS

| | | | | |
|---|---|---|---|---|
| 2014/0374475 | A1* | 12/2014 | Kallfelz | H01M 10/4285 235/375 |
| 2016/0011270 | A1* | 1/2016 | Poirier | H01M 10/488 324/426 |
| 2018/0109121 | A1 | 4/2018 | Uchida | |
| 2018/0222343 | A1 | 8/2018 | Uchida | |
| 2019/0195953 | A1 | 6/2019 | Komiyama | |

FOREIGN PATENT DOCUMENTS

| | | |
|---|---|---|
| JP | 2005-346170 A | 12/2005 |
| JP | 2006-277525 A | 10/2006 |
| JP | 2018-063906 A | 4/2018 |
| JP | 2018-128769 A | 8/2018 |
| JP | 2019-114450 A | 7/2019 |

\* cited by examiner

*Primary Examiner* — Kristy A Haupt
(74) *Attorney, Agent, or Firm* — Oliff PLC (57) ABSTRACT

A battery degradation authentication device includes: a communication portion configured to communicate with a server; an input portion configured to receive specification information to specify a specific battery as a battery selected by a user; and an output portion. The communication portion acquires battery information including at least one of degradation information of the specific battery and related information related to the degradation information from the server. The output portion outputs an authentication mark based on which the battery information is acquirable.

7 Claims, 6 Drawing Sheets

BATTERY DEGRADATION AUTHENTICATION DEVICE AND BATTERY DEGRADATION AUTHENTICATION SYSTEM

INCORPORATION BY REFERENCE

The disclosure of Japanese Patent Application No. 2018-218611 filed on Nov. 21, 2018 including the specification, drawings and abstract is incorporated herein by reference in its entirety.

BACKGROUND

1. Technical Field

This disclosure relates to a battery degradation authentication device and a battery degradation authentication system.

2. Description of Related Art

In recent years, various systems and services focusing on a used battery provided in a vehicle have attracted attention. For example, a battery replacement support system described in Japanese Unexamined Patent Application Publication No. 2018-128769 (JP 2018-128769 A) is a system configured to provide, to a user, information based on which the user determines whether or not a battery should be replaced with a new battery or a used battery in a case of replacement of the battery.

The system includes an operating portion operated by the user, a server including pieces of information on a plurality of batteries, and a display portion configured to inform the user of a candidate battery for replacement.

The server acquires a degraded state of a user battery provided in a vehicle of the user and further calculates a life that allows the vehicle to travel until a capacity retention rate of the user battery reaches a predetermined threshold. The server then selects a battery having a life longer than a period until replacement of the user battery by purchase as a candidate battery for replacement.

The server transmits, to the display portion, information indicative of the candidate battery for replacement and information indicative of cost or the like necessary to replace the battery.

SUMMARY

In the system, the user can acquire information about a battery as a candidate battery for replacement. In the meantime, the user tends to consider replacement of the battery or replacement of the vehicle by purchase after the user grasps a market value of the user battery.

However, in the present situation, a system in which the user can be accurately informed of a market value of a battery in use, for example, has not been examined.

Generally, it is difficult to grasp a degraded state of a battery in a short time, and estimation of degradation information of a battery requires a suitable facility and various pieces of information on a target battery.

On this account, purchase traders of used vehicles and used batteries cannot accurately grasp a market value of a battery, thereby resulting in that the battery might be handled cheaply unreasonably.

This disclosure is accomplished in view of the above problems, and an object of this disclosure is to provide a battery degradation authentication device and a battery degradation authentication system each of which can easily acquire a value of a battery of a user.

A battery degradation authentication device according to this disclosure includes a communication portion, an input portion, and an output portion. The communication portion is configured to communicate with a server. The input portion is configured to receive specification information to specify a specific battery as a battery selected by a user. The communication portion acquires battery information including at least one of degradation information of the specific battery and related information related to the degradation information from the server. The output portion outputs an authentication mark based on which the battery information is acquirable.

With the battery degradation authentication device, the user can acquire the battery information including at least one of the degradation information of the battery and the related information related to the degradation information.

In the battery degradation authentication device, the authentication mark may include a code readable by capturing an image of the code, and a reader may read the code and acquire the battery information stored in the server.

With the battery degradation authentication device, a trader having the reader can easily acquire various pieces of information about the battery.

In the battery degradation authentication device, the server may calculate the battery information by calculating a degradation degree of the specific battery to be obtained when a recovering process is performed on the specific battery.

With the battery degradation authentication device, it is possible to determine the value of the battery at the time when a refresh operation or the like is performed, for example.

In the battery degradation authentication device, the authentication mark may be formed such that expiring date information indicative of an expiring date of the battery information is acquirable from the authentication mark.

With the battery degradation authentication device, it is possible to restrain the value of the battery from being determined based on old data.

In the battery degradation authentication device, the server may acquire history information indicative of a usage history of the battery, and the expiring date information may be calculated based on the specification information and the history information. With the battery degradation authentication device, it is possible to accurately set the expiring date.

In the battery degradation authentication device, the authentication mark may include an adhesive layer, and the authentication mark may be configured to be attachable to an attachment target object. With the authentication mark configured as such, the authentication mark can be attached to a battery outer case, a windshield, or the like, for example.

A battery degradation authentication system according to this disclosure includes a vehicle, a server, a battery degradation authentication device, and an acquisition device. The vehicle includes a battery. The server is communicable with the vehicle and includes degradation information indicative of a degradation degree of the battery. The battery degradation authentication device is communicable with the server and configured to output an authentication mark based on which degradation information of a specific battery specified by a user is acquirable. The acquisition device is configured to acquire the degradation information of the specific battery based on the authentication mark.

With the battery degradation authentication system, a trader having the acquisition device can acquire information based on which the value of the battery is determined.

With the battery degradation authentication device and the battery degradation authentication system according to this disclosure, it is possible to easily acquire the value of the battery of the user.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

With reference to FIGS. 1 to 6, the following describes a battery degradation authentication system 1 according to the present embodiment. Among constituents illustrated in FIGS. 1 to 6, the same or substantially the same constituent has the same reference sign, and redundant descriptions thereof are omitted. Note that, among constituents described in the embodiment, a constituent corresponding to a constituent described in Claims may be described with the constituent as described in Claims in parentheses.

Figure 1:
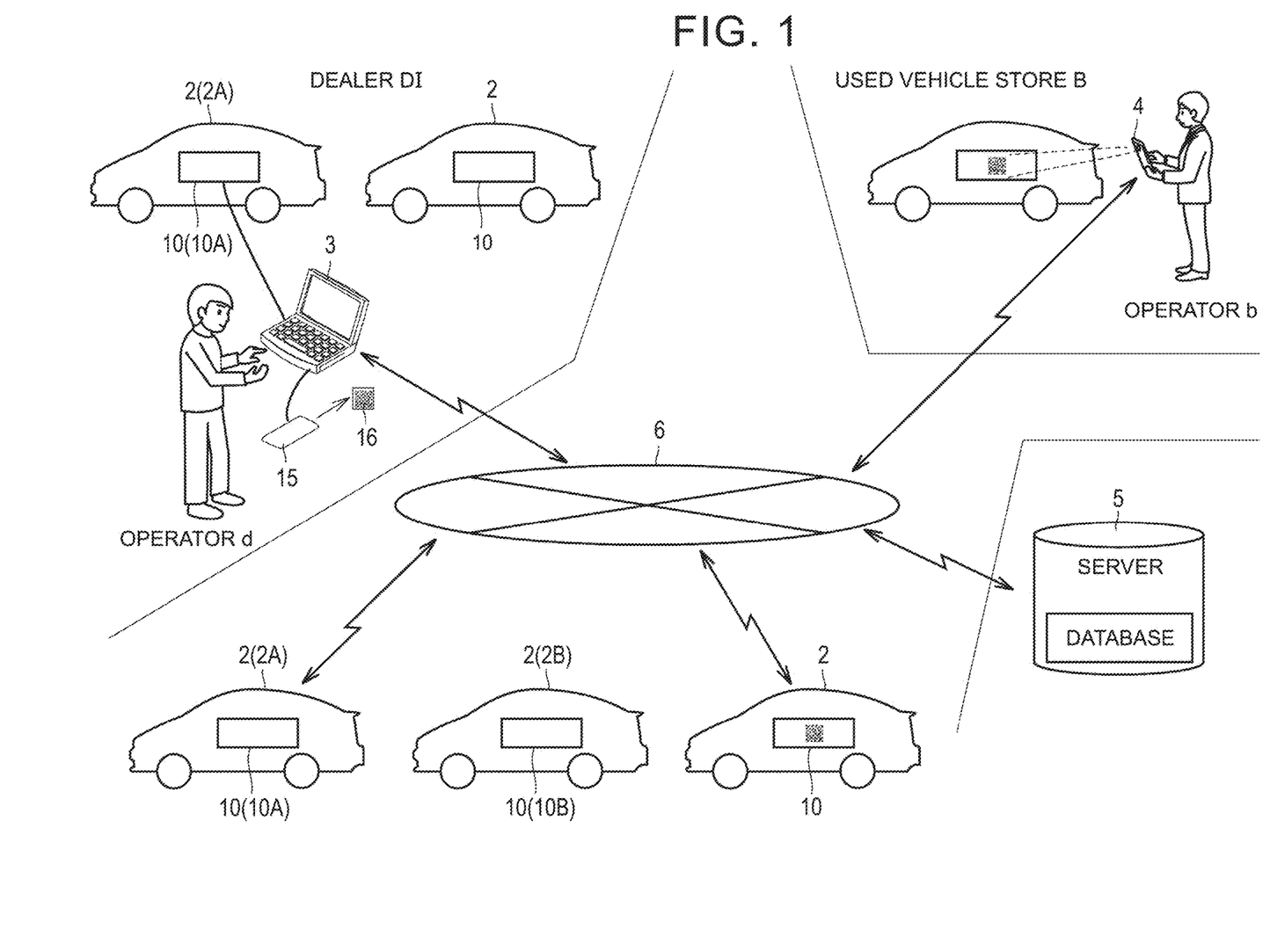
FIG. 1 is a schematic view illustrating a battery degradation authentication system 1 according to the present embodiment.

FIG. 1 is a schematic view illustrating the battery degradation authentication system 1 according to the present embodiment. The battery degradation authentication system 1 includes a plurality of vehicles 2, a dealer terminal (battery degradation authentication device) 3, a trader terminal 4, and a server 5.

The vehicles 2, the dealer terminal 3, and the trader terminal 4 are communicable with the server 5 via the Internet 6 or the like.

The vehicle 2 is an electrically driven vehicle or the like such as a hybrid vehicle or an electric vehicle. The dealer terminal 3 is, for example, a terminal to be used by an operator d in a dealer DI. The trader terminal 4 is, for example, a terminal to be used by an operator b in a used vehicle store B.

Each vehicle 2A is communicable with the server 5 via the Internet 6 or the like. The vehicle 2A continuously transmits, to the server 5, information indicative of a travel history of the vehicle 2A, information indicative of a charge-discharge amount and a temperature of a battery 10, and so on. A vehicle 2B is a vehicle that does not have a function to communicate with the server 5.

Various pieces of information such as the information indicative of the travel history of the vehicle 2A and the information indicative of the charge-discharge amount and the temperature of the battery 10 are stored in the server 5.

The operator d may be requested by an owner of the vehicle 2A to provide an estimate of a market value of a battery 10A provided in the vehicle 2A in some cases.

At this time, the operator d inputs specification information to specify the battery 10A into the dealer terminal 3. The dealer terminal 3 transmits, to the server 5, the specification information thus input.

When the server 5 receives the specification information to specify the battery 10A, a capacity retention rate Q of the battery 10A and a resistance maintenance factor IR are calculated based on usage history information or the like about the battery 10A. Further, a value index R of the battery 10A is calculated based on the capacity retention rate Q and the resistance maintenance factor IR. Further, the server 5 calculates an effective period T indicative of an expiring date by which the operator b, the operator d, or the like can use the calculated capacity retention rate Q, the calculated resistance maintenance factor IR, and the calculated value index R.

When the server 5 calculates the capacity retention rate Q of the battery 10A, the resistance maintenance factor IR, the value index R, and the effective period T, the server 5 stores them in a storage portion of the server 5. Then, the server 5 transmits, to the dealer terminal 3, the capacity retention rate Q of the battery 10A, the value index R, and the effective period T.

When the dealer terminal 3 receives the capacity retention rate Q of the battery 10A, the resistance maintenance factor IR, the value index R, and the effective period T from the server 5, the dealer terminal 3 displays them on a display portion of the dealer terminal 3.

The dealer terminal 3 includes an output portion 15, and the output portion 15 is configured to output a seal (authentication mark) 16. A code 17 is described on the seal 16. Note that the specification information to specify the battery 10A, the capacity retention rate Q of the battery 10A, the resistance maintenance factor IR, the value index R, and the effective period T may be described on the seal 16. The seal 16 can be attached to a surface or the like of a case of the battery 10A, for example. As such, the owner of the vehicle 2A can know the market value of the battery 10A. Meanwhile, the owner of the vehicle 2A may desire to know an exercise price of the vehicle 2A in a used vehicle store B other than the dealer DI.

The owner of the vehicle 2A may request the used vehicle store B to provide an estimate of the exercise price of the vehicle 2A or the battery 10A, for example. The used vehicle store B may not own an instrument that accurately measures the degraded state of the battery 10A. Even in such a case, the operator b of the used vehicle store B reads the code 17 of the seal 16 attached on the battery 10A by use of the trader terminal 4.

When the trader terminal 4 reads the code 17, the trader terminal 4 can access the server 5, so that the trader terminal 4 can acquire, from the server 5, information on the capacity retention rate Q of the battery 10A, information on the resistance maintenance factor IR, information on the value index R, and information on the effective period T. Further, a display portion is provided in the trader terminal 4, and the information on the capacity retention rate Q, the information on the value index R, and the information on the effective period T thus acquired from the server 5 can be displayed on the display portion.

As such, with the battery degradation authentication system 1 in the present embodiment, even a trader such as the operator b who cannot measure the degraded state of a battery can acquire information based on which an accurate value of the battery 10A is determined.

Figure 2:
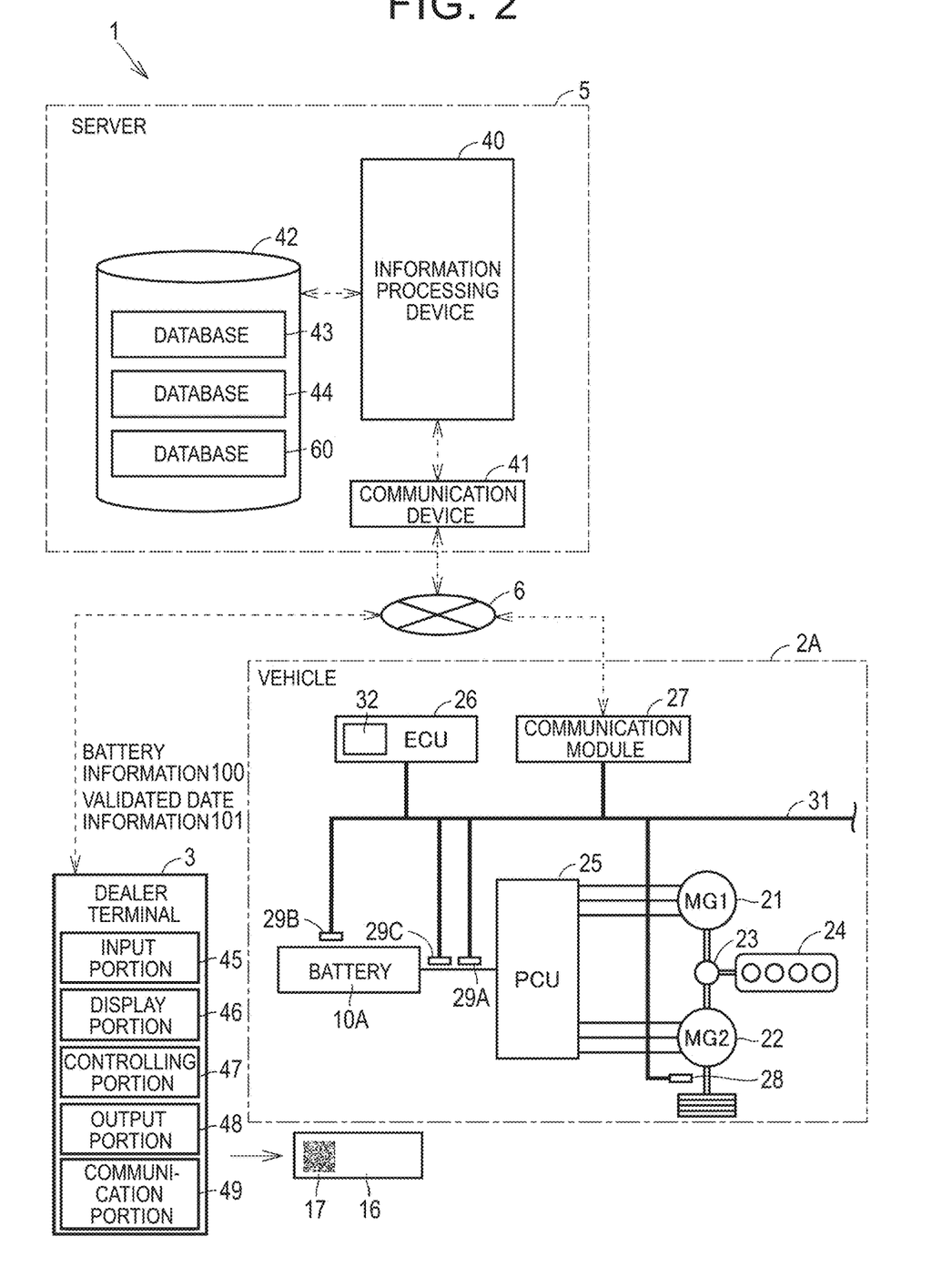
FIG. 2 is a block diagram illustrating configurations of a server 5 and a vehicle 2A.

Along with this, the market value of the battery 10A is less likely to be estimated to be low, so that the owner of the vehicle 2A is less likely to suffer a disadvantage. With reference to FIG. 2 and the like, the following will describe the configuration of the battery degradation authentication system 1 and so on in detail. FIG. 2 is a block diagram illustrating the configurations of the server 5 and the vehicle 2A.

Note that the vehicle 2A illustrated in FIG. 2 will be described as a hybrid vehicle as an example, but the vehicle is not limited to the hybrid vehicle as described above.

The vehicle 2A includes a battery 10A, motor generators (MG) 21, 22, a power split device 23, an engine 24, a power control unit (PCU) 25, an electronic control unit (ECU) 26, a communication portion (communication module) 27, a sensor 28, a current sensor 29A, a temperature sensor 29B, and an in-vehicle local area network (LAN) 31.

The battery 10A is, for example, a lithium ion battery, a nickel-metal hydride battery, or the like, and the battery 10A includes a plurality of battery cells.

The motor generators 21, 22 are three-phase alternating-current rotary electric machines, for example. The motor generator 21 is connected to a crankshaft of the engine 24 via the power split device 23. When the engine 24 is to be started, the motor generator 21 rotates the crankshaft of the engine 24 by use of electric power of the battery 10A. Further, the motor generator 21 can also generate electric power by use of power of the engine 24. Alternating current power generated by the motor generator 21 is converted into direct current power by the PCU 25, so that the battery 10A is charged with the direct current power. Further, the alternating current power generated by the motor generator 21 may be supplied to the motor generator 22.

The motor generator 22 rotates a driving shaft by use of at least one of the electric power stored in the battery 10A and the electric power generated by the motor generator 21. Further, the motor generator 22 can also generate electric power by regenerative braking. Alternating current power generated by the motor generator 22 is converted into direct current power by the PCU 25, so that the battery 10A is charged with the direct current power.

The PCU 25 includes an inverter and a converter and, for example, supplies the direct current power from the battery 10A to the motor generators 21, 22 or converts the alternating current power from the motor generators 21, 22 into direct current power and supplies it to the battery 10A. The in-vehicle LAN 31 connects the battery 10A, the PCU 25, the ECU 26, the communication portion 27, and a connection port 30 to each other.

The sensor 28 transmits a rotation number of a drive shaft connected to a driving wheel to the ECU 26. The current sensor 29A detects a current amount flowing in or out from the battery 10A and transmits it to the ECU 26. The temperature sensor 29B detects a temperature of the battery 10A and transmits it to the ECU 26. The voltage sensor 29C detects a voltage of the battery 10A and transmits it to the ECU 26.

The ECU 26 includes a central processing unit (CPU), input and output buffers (not shown), and a memory 32 (a read only memory (ROM) and a random access memory (RAM)).

The ECU 26 calculates a travel distance of the vehicle 2A based on information received from the sensor 28 and stores the travel distance thus calculated in the memory.

The ECU 26 estimates SOC of the battery 10A based on pieces of information received from the current sensor 29A, the temperature sensor 29B, and the voltage sensor 29C and stores it in the memory.

Then, the ECU 26 calculates the capacity retention rate Q of the battery 10A. Note that various methods can be employed as a calculation method of the capacity retention rate Q.

For example, the ECU 26 estimates the SOC of the battery 10A twice. The ECU 26 measures an electric power amount ΔAh charged to and discharged from the battery 10A between the two estimations of the SOC by current accumulation by use of the current sensor 29A. In this case, the ECU 26 can calculate a full charge capacity C of the battery 10A in accordance with Equation (1) by use of S1, S2 as estimated results of the SOC estimation process performed twice and the charge-discharge electric power amount ΔAh.

Note that, in Equation (1), a reference distance Db is a distance set in advance. For example, the reference distance Db is a distance longer than a distance (from a few kilometers to 100 kilometers) by which the vehicle 2A is supposed to travel before the vehicle 2A is delivered to the user, and the reference distance Db is set to a distance of 110 kilometers or the like, for example.

$$C=\Delta Ah/(S1-S2)\times 100 \tag{1}$$

The capacity retention rate Q of the battery 10A is calculated by dividing the full charge capacity C calculated in accordance with Equation (1) by an initial value C0 of the full charge capacity of the battery 10A (a value at the point when the travel distance D reaches the reference distance Db) (see Equation (2)).

$$Q=C/C0\times 100 \tag{2}$$

Further, as the initial value C0 of the full charge capacity, a full charge capacity (catalogue value) of the battery 10A at the time of manufacture of the vehicle 2A (or the battery 10A) may be used instead of using the full charge capacity at the point when the travel distance D reaches the reference distance Db. Note that the resistance maintenance factor IR can be calculated from the capacity retention rate Q.

Then, the ECU 26 stores the calculated capacity retention rate Q and the calculated resistance maintenance factor IR in the memory 32. Note that battery specification information to specify the battery 10A and vehicle specification information of the vehicle 2 provided with the battery 10A are stored in the memory 32, for example. The battery specification information includes, for example, information indicative of a maker of the battery 10A, information indicative of a type of the battery 10A (a type such as a lithium ion battery or a nickel-metal hydride battery), information indicative of a battery capacity of the battery 10A at the time when the battery 10A is new, information indicative of a production number of the battery 10A, and so on. The vehicle specification information includes, for example, information indicative of a vehicle identification number, and the like.

In a case where the battery 10A is a nickel-metal hydride battery, the ECU 26 may perform refresh charge and discharge at a predetermined timing. It is known that a memory effect occurs in the nickel-metal hydride battery. The memory effect is a phenomenon that, when charging (so-called additional charging) is repeated in a state where electric power stored in the nickel-metal hydride battery is not completely consumed, a discharge voltage of the nickel-metal hydride battery becomes low in comparison with a normal time (when no memory effect occurs). The memory effect may also occur on a charging side of the nickel-metal hydride battery, and on the charging side, a charging voltage becomes high in comparison with the normal time.

The ECU 26 controls the PCU 25 such that the SOC (State of Charge) of the battery is maintained within a predetermined range at the time when refresh charge and discharge are not performed, but the SOC of the battery exceeds an upper limit of the predetermined range at the time when refresh charge is performed. Further, the ECU 26 controls the PCU 25 such that the SOC of the battery becomes lower than a lower limit of the predetermined range at the time when refresh discharge is performed.

In a case where the battery 10A is a nickel-metal hydride battery, the memory effect caused in the battery 10A can be cancelled by performing refresh charge and discharge as described above.

When refresh charge and discharge are performed, the ECU 26 stores, in the memory 32, information indicative of execution timings of refresh charge and discharge. The communication portion 27 is communicable with the server 5 via the Internet 6.

The communication portion 27 transmits, to the server 5, battery specification information to specify the battery 10A, vehicle specification information, SOC history information of the battery 10A, information indicative of the capacity retention rate Q of the battery 10A, information indicative of the resistance maintenance factor IR, information indicative of the travel distance of the vehicle 2A, information indicative of a temperature history of the battery 10A, and information indicative of the execution timings of refresh charge and discharge. Note that, in a case where the battery 10A is a lithium ion battery, the information indicative of the execution timings of refresh charge and discharge is not transmitted to the server 5. Note that the SOC history information of the battery 10A is information indicative of a time-dependent change of the SOC of the battery 10A. The information indicative of the temperature history of the battery 10A is information indicative of a time-dependent change of the temperature of the battery 10A.

As a timing when the communication portion 27 transmits those pieces of information to the server 5, the communication portion 27 may be configured to perform communication with the server 5 all the time or may transmit the pieces of information at predetermined time intervals.

The communication portion 27 is configured to be communicable with the server 5. The server 5 includes a computing processing portion 40, a communication portion 41, and a storage portion 42. The communication portion 41 is configured to be communicable with the communication portion 27.

The computing processing portion 40 stores, in the storage portion 42, battery specification information to specify the battery 10, vehicle specification information, SOC history information of the battery 10, information indicative of a capacity retention rate Q of the battery 10, information indicative of a resistance maintenance factor IR, information indicative of the travel distance of the vehicle 2A, information indicative of a temperature history of the battery 10, and information indicative of execution timings of refresh charge and discharge. Those pieces of information are received via the communication portion 41.

In the storage portion 42, a value index database 43, a guarantee period database 44, and a transmission history database 60 are stored. The value index database 43 is a database for calculating a value index R indicative of a market value of a battery based on battery specification information to specify a battery and a capacity retention rate Q (or a resistance maintenance factor IR) of the battery. Accordingly, the content of the value index database 43 can be updated based on information from a battery market. Note that, in a case where the battery is a nickel-metal hydride battery, the value index R is set in consideration of whether refresh charge and discharge are performed or not.

The guarantee period database 44 is a database for calculating an effective period T based on battery specification information to specify a battery, information indicative of a temperature history of the battery, information indicative of a charge-discharge amount of the battery, and SOC history information of the battery. Note that details about the guarantee period database 44 and the effective period T will be described later. The transmission history database 60 is a database in which a transmission content transmitted from the server 5 to the dealer terminal 3 is stored.

The dealer terminal 3 includes an input portion 45, a display portion 46, a controlling portion 47, an output portion 48, and a communication portion 49.

The input portion 45 is, for example, a part into which the operator d inputs various pieces of information. The controlling portion 47 controls driving of the input portion 45, the display portion 46, the output portion 48, and the communication portion 49. The display portion 46 is an instrument configured to display information received from the server 5. The communication portion 49 is configured to be communicable with the communication portion 41. The output portion 48 is a device configured to output the seal 16 on which the code 17 is described.

For example, the operator d inputs specification information to specify the battery 10A into the input portion 45. Here, the specification information of the battery 10A that the operator d inputs into the input portion 45 may be a production number of the battery 10A or may be a vehicle identification number of the vehicle 2A provided with the battery 10A, and the like.

The controlling portion 47 transmits the specification information of the battery 10A that is specified by the operator d in the input portion 45 to the communication portion 41 via the communication portion 49.

The computing processing portion 40 acquires, from the storage portion 42, information indicative of the capacity retention rate Q of the battery 10A, information indicative of the resistance maintenance factor IR of the battery 10A, and battery specification information to specify the battery 10A from the specification information of the battery 10A received via the communication portion 41.

The computing processing portion 40 calculates the value index R of the battery 10A by use of the value index database 43, the information indicative of the capacity retention rate Q of the battery 10A, and the battery specification information to specify the battery 10A.

The computing processing portion 40 transmits battery information 100 indicative of the capacity retention rate Q, the resistance maintenance factor IR, and the value index R of the battery 10A to the dealer terminal 3 via the communication portion 41. Note that, in the present embodiment, battery information that the server 5 transmits to the dealer terminal 3 includes both the information indicative of the capacity retention rate Q and the information indicative of the value index R, but may be at least either of the information indicative of the capacity retention rate Q and the information indicative of the value index R.

Here, in a case where the vehicle 2A is a vehicle that can perform refresh charge and discharge, when the battery 10A is a nickel-metal hydride battery and it is determined that refresh charge and discharge are not performed within a predetermined period, the computing processing portion 40 of the server 5 calculates a correction capacity retention rate Q1 to be obtained when refresh charge and discharge are performed. Then, the computing processing portion 40 calculates a correction value R1 of the value index of the battery 10A after the refresh based on the correction capacity retention rate Q and the value index database 43. Note that the server 5 receives, from each vehicle, information indicative of whether or not the vehicle is a vehicle that can perform refresh charge and discharge.

Then, the computing processing portion 40 transmits, to the dealer terminal 3 via the communication portion 41, the battery information 100 indicative of the capacity retention rate Q, the resistance maintenance factor IR, and the value index R of the battery 10A, the correction capacity retention rate Q1, and the correction value R1 of the value index.

At this time, the server 5 transmits the battery information 100 on the battery 10A and transmits expiring date information indicative of an expiring date of the battery information 100 to the dealer terminal 3.

The expiring date information 101 is a period during which the content of the battery information 100 transmitted from the server 5 to the dealer terminal 3 is guaranteed.

For example, right after the server 5 transmits the battery information 100 to the dealer terminal 3, the content of the battery information 100 hardly differs from an actual capacity retention rate Q, an actual resistance maintenance factor IR, and an actual market value of the battery 10A. In the meantime, when the battery 10A repeats charge and discharge as time elapses, degradation of the battery 10A progresses, so that a difference between the content of the battery information 100 and the actual capacity retention rate Q or the actual market value becomes large. In view of this, the expiring date information 101 is information indicative of an effective period T during which it is expected that the difference between the content of the battery information 100 and the actual capacity retention rate Q or the actual market value is small.

Generally, when charge and discharge are repeated in a lithium ion battery or a nickel-metal hydride battery in a state where the battery temperature is high, the lithium ion battery degrades in a short period. In the lithium ion battery, the degradation progresses as a state where the SOC is high is kept longer.

The guarantee period database 44 is a database for calculating the effective period T based on information indicative of a battery usage history of the battery 10A and the battery specification information to specify the battery 10A. The information indicative of the battery usage history of the battery 10A includes the SOC history information of the battery 10A, information indicative of a temperature history of the battery 10A, and information indicative of a charge-discharge amount history of the battery 10A.

Note that the server 5 acquires, from the vehicle 2A, the SOC history information of the battery 10A, the information indicative of the temperature history of the battery 10A, and the information indicative of the charge-discharge amount history of the battery 10A.

Then, the computing processing portion 40, for example, calculates the effective period T of the battery information 100 based on the information indicative of the battery usage history of the battery 10A, the battery specification information of the battery 10A, and the guarantee period database 44.

For example, when a state where the battery temperature of the battery 10A is high continues for a long term, the effective period T becomes short, and when a state where the SOC of the battery 10A is high continues for a long term, and further when the charge-discharge amount of the battery 10A increases, the effective period T becomes short.

The computing processing portion 40 transmits expiring date information 101 indicative of the effective period T to the dealer terminal 3 together with the battery information 100 via the communication portion 41.

The computing processing portion 40 stores, in a transmission history database 60 of the storage portion 42, transmission history information indicative of information transmitted to the dealer terminal 3. More specifically, the transmission history information includes the battery information 100 and the expiring date information 101, and further more specifically, the transmission history information includes the capacity retention rate Q of the battery 10A, the resistance maintenance factor IR, the value index R, the effective period T, and the information to specify the battery 10A. Note that, in a case where the information transmitted to the dealer terminal 3 includes the correction capacity retention rate Q1 and the correction value R1 of the value index, these pieces of information are also stored in the transmission history database 60.

The controlling portion 47 of the dealer terminal 3 displays, on the display portion 46, the battery information 100 and the expiring date information 101 received from the server 5. Hereby, the operator d and the owner of the vehicle 2A can estimate the market value or the like of the battery 10A. The controlling portion 47 drives the output portion 48 and outputs the seal 16 on which the code 17 is printed.

Note that the vehicle 2A is configured to transmit various pieces of information to the server 5 via the communication portion 27, but some vehicles cannot communicate with the server 5.

Figure 3:
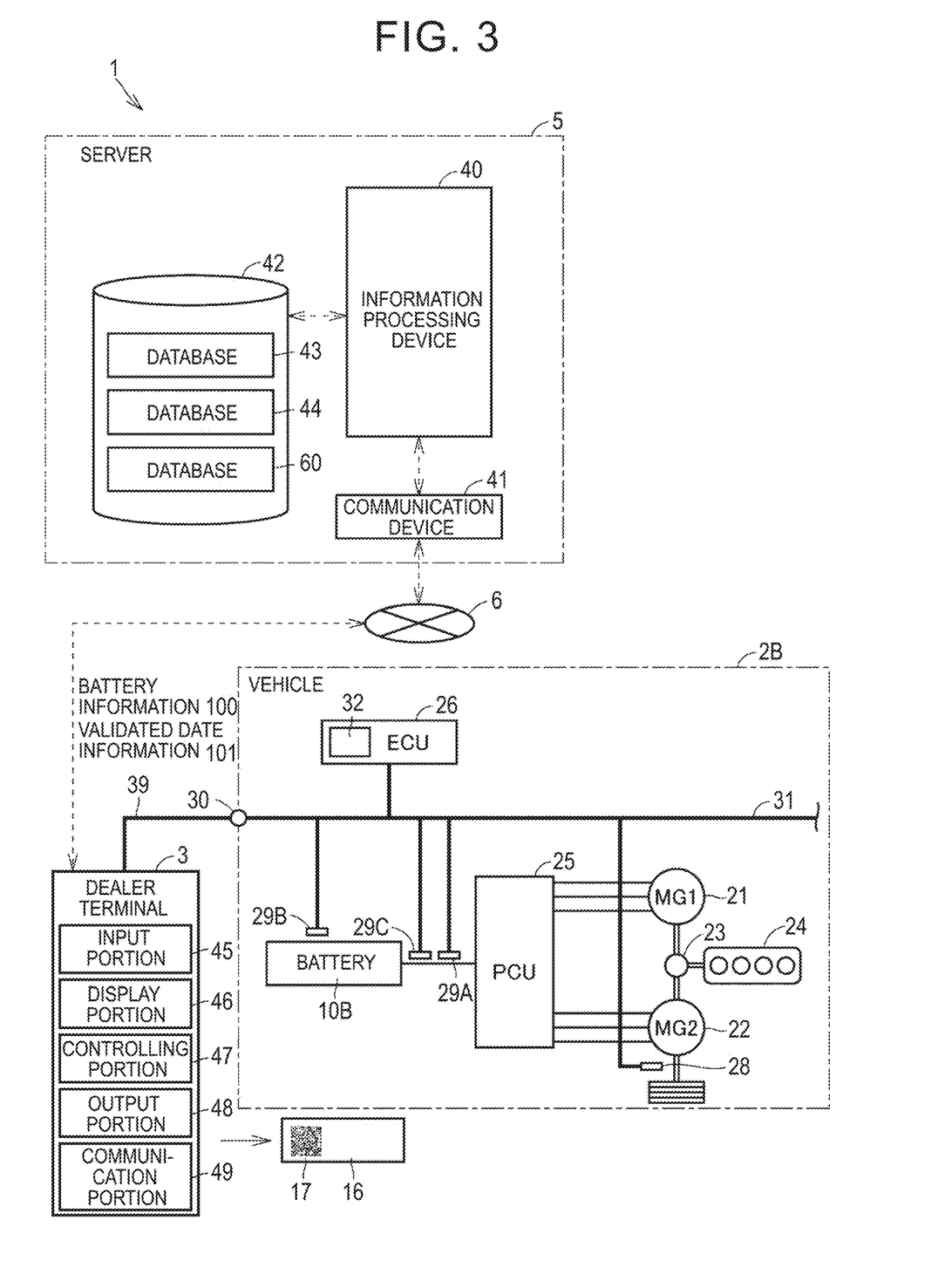
FIG. 3 is a block diagram illustrating a vehicle 2B, a server 5, and a dealer terminal 3.

FIG. 3 is a block diagram illustrating the vehicle 2B, the server 5, and the dealer terminal 3. Differently from the vehicle 2A, the vehicle 2B is a vehicle that does not include the communication portion 27 and does not communicate with the server 5.

Similarly to the vehicle 2A, the vehicle 2B includes a battery 10B, the motor generators 21, 22, the power split device 23, the engine 24, the PCU 25, the ECU 26, the sensor 28, the current sensor 29A, the temperature sensor 29B, and the in-vehicle LAN 31. The vehicle 2B includes the connection port 30 connected to the in-vehicle LAN 31. The dealer terminal 3 is configured such that a communication cord 39 is connectable to the connection port 30.

In the vehicle 2B, the ECU 26 stores, in the memory 32, SOC history information of the battery 10B, information indicative of a capacity retention rate Q of the battery 10B, information indicative of a resistance maintenance factor IR, information indicative of a travel distance of the vehicle 2B, and information indicative of a temperature history of the battery 10B. Note that, in a case where refresh charge and discharge are performed, the ECU 26 stores, in the memory 32, information indicative of execution timings of refresh charge and discharge.

Note that battery specification information to specify the battery 10B and vehicle specification information to specify the vehicle 2B are stored in the memory 32 in advance.

By connecting the communication cord 39 to the connection port 30, the dealer terminal 3 can acquire the SOC history information of the battery 10B, the information indicative of the capacity retention rate Q of the battery 10B, the information indicative of the resistance maintenance factor IR, the information indicative of the travel distance of the vehicle 2B, the information indicative of the temperature history of the battery 10B, the information indicative of the execution timings of refresh charge and discharge, the battery specification information to specify the battery 10B, and the vehicle specification information to specify the vehicle 2B. The dealer terminal 3 transmits those pieces of information acquired from the vehicle 2B to the server 5.

The server 5 stores, in the storage portion 42, the SOC history information of the battery 10B, the information indicative of the capacity retention rate Q of the battery 10B, the information indicative of the resistance maintenance factor IR, the information indicative of the travel distance of the vehicle 2B, the information indicative of the temperature history of the battery 10B, the information indicative of the execution timings of refresh charge and discharge, the battery specification information to specify the battery 10B, and the vehicle specification information to specify the vehicle 2B.

Then, the computing processing portion 40 calculates a value index R based on the capacity retention rate Q, the resistance maintenance factor IR, the battery specification information, and the value index database 43. Further, the computing processing portion 40 calculates an effective period T based on the guarantee period database 44, usage history information indicative of a battery usage history of the battery 10B, and the battery specification information of the battery 10B. Then, the computing processing portion 40 transmits battery information 100 including information indicative of the capacity retention rate Q and information indicative of the value index R and expiring date information 101 indicative of the effective period T to the dealer terminal 3.

The computing processing portion 40 stores the content of the battery information 100 and the expiring date information 101 transmitted to the dealer terminal 3 in the transmission history database 60. Note that in a case where the information transmitted to the dealer terminal 3 includes a correction capacity retention rate Q1 and a correction value R1 of the value index, these pieces of information are also stored in the transmission history database 60.

The dealer terminal 3 outputs the seal 16 based on the battery information 100 and the expiring date information 101 thus received.

Figure 4:
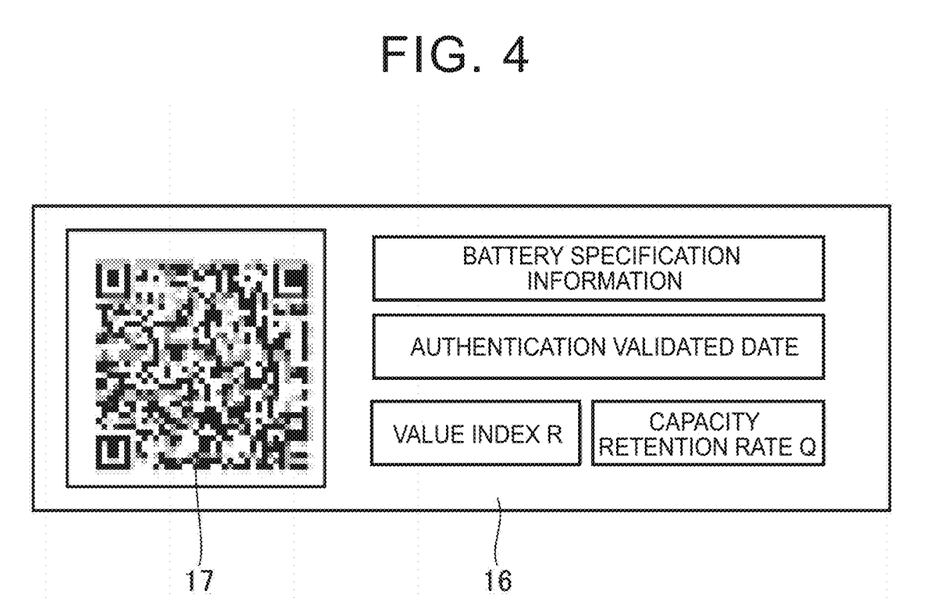
FIG. 4 is a plan view schematically illustrating a seal 16.

FIG. 4 is a plan view schematically illustrating the seal 16. Note that, in terms of the seal 16 illustrated in FIG. 4, an example in which information about the battery 10A is described will be described.

An adhesive layer is formed on the back face of the seal 16, so that the seal 16 can be attached to the surface of the battery.

The code 17 is described on the front face of the seal 16. Note that, as illustrated in FIG. 4, information to specify the battery, information to specify the vehicle, information indicative of the effective period T, information indicative of the capacity retention rate Q, and information indicative of the value index R may be described on the front face of the seal 16.

The code 17 is a Qr code, for example, and information to specify the battery and an address (URL) to access the server 5 are stored in the code 17, for example.

The operator d attaches the output seal 16 to the surface of the battery 10A, an end of a windshield of the vehicle 2A, and the like.

Figure 5:
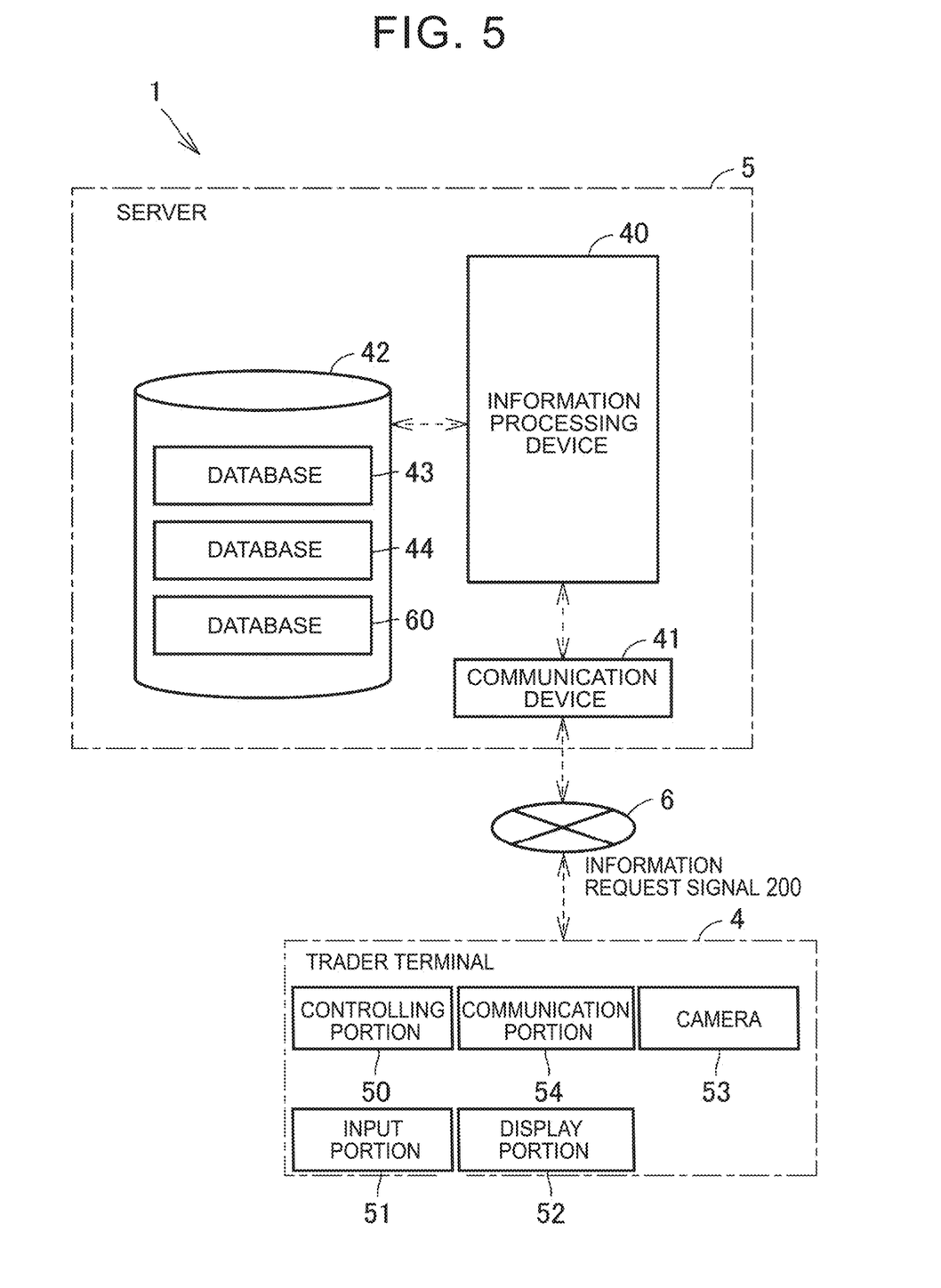
FIG. 5 is a view illustrating a system configuration of a trader terminal 4 and the server 5.

FIG. 5 is a view illustrating a system configuration of the trader terminal 4 and the server 5. The trader terminal 4 includes a controlling portion 50, an input portion 51, a display portion 52, a camera 53, and a communication portion 54.

The controlling portion 50 controls driving of the input portion 51, the display portion 52, the camera 53, and the communication portion 54. The input portion 51 is, for example, a device into which the operator b inputs various pieces of information.

The display portion 52 is a device configured to display various pieces of information. The communication portion 54 is configured to be communicable with the communication portion 41. The camera 53 is a device configured to read the code 17 described on the seal 16.

Figure 6:
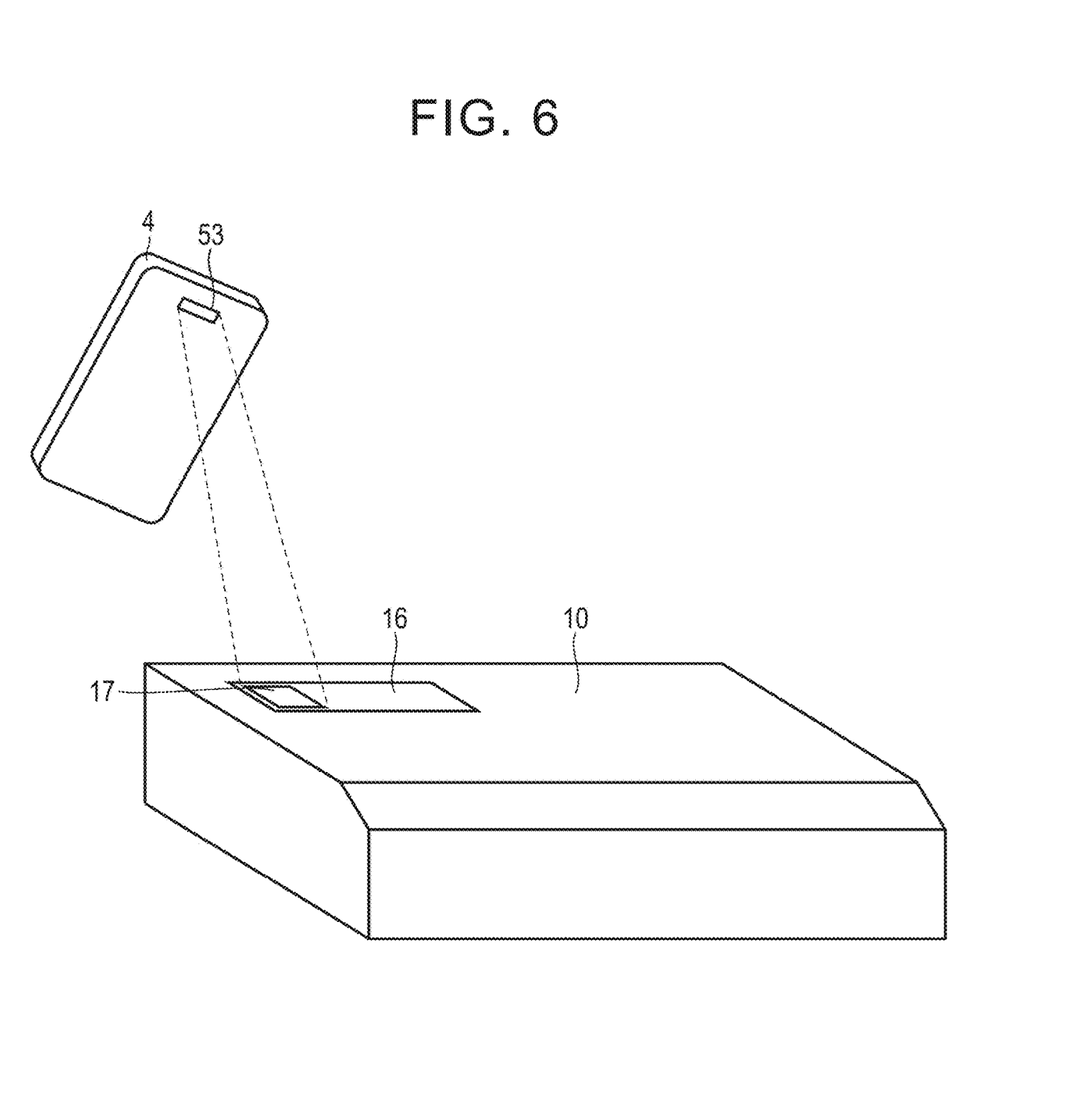
FIG. 6 is a perspective view schematically illustrating a state where an image of a code 17 of a seal 16 attached to a battery outer case is captured.

FIG. 6 is a perspective view schematically illustrating a state where an image of the code 17 on the seal 16 attached to a battery outer case is captured.

When the operator d reads the code 17 on the seal 16 by use of the camera 53, the operator d acquires the address (URL) to access the server 5 and the information to specify the battery 10A to which the seal 16 is attached.

In FIG. 5, the information to specify the battery 10A and a start button to access the server 5 are displayed on the display portion 52, for example.

When the operator d presses the start button, the controlling portion 50 transmits an information request signal 200 to the server 5 via the communication portion 54. The information request signal 200 includes the information to specify the battery 10A.

When the computing processing portion 40 of the server 5 receives the information request signal 200, the computing processing portion 40 transmits the capacity retention rate Q of the battery 10A, the resistance maintenance factor IR, the value index R, the effective period T, and the information to specify the battery 10A, stored in the transmission history database 60, to the trader terminal 4 via the communication portion 41. Note that, in a case where the correction capacity retention rate Q1 and the correction value R1 of the value index are stored in the transmission history database 60, these pieces of information are also transmitted to the trader terminal 4.

When the trader terminal 4 receives the capacity retention rate Q of the battery 10A, the resistance maintenance factor IR, the value index R, and the effective period T from the server 5, the trader terminal 4 displays them on the display portion 52. Note that, in a case where the correction capacity retention rate Q1 and the correction value R1 of the value index are also acquired, these pieces of information are also displayed on the display portion 52.

The operator b of the used vehicle store B can acquire information based on which the market value of the battery 10A is determined, so that the operator b can accurately evaluate the battery 10A.

Note that, in the above embodiment, the vehicle 2 calculates the capacity retention rate Q by the ECU 26, but the vehicle 2 may transmit pieces of information or the like from the current sensor 29A and the voltage sensor 29C to the server 5, and the server 5 may calculate the capacity retention rate Q. Note that, in the above embodiment, the trader terminal 4 is not provided with an instrument configured to output the seal 16 like the output portion 48 of the dealer terminal 3, but the trader terminal 4 may have a function to output the seal 16 like the output portion 48 of the dealer terminal 3.

It should be considered that the embodiment described herein is just an example in all respects and is not limitative. The scope of the disclosure is shown by Claims and is intended to include all modifications made within the meaning and scope equivalent to Claims.

What is claimed is:

1. A battery degradation authentication device comprising:
   a communication portion configured to communicate with a server;
   an input portion configured to receive specification information to specify a specific battery as a battery selected by a user; and
   an output portion, wherein:
      the communication portion acquires battery information calculated by the server, the battery information including at least one of degradation information of the specific battery and related information related to the degradation information from the server;
      the server calculates the battery information of the specific battery based on data that is continuously transmitted to the server from a vehicle including the battery, the data including a travel history of the vehicle and properties of the battery; and
      the output portion outputs an authentication mark based on which the calculated battery information is acquirable.

2. The battery degradation authentication device according to claim 1, wherein:
   the authentication mark includes a code readable by capturing an image of the code; and
   a reader reads the code and acquires the battery information stored in the server.

3. The battery degradation authentication device according to claim 1, wherein the server calculates the battery information by calculating a degradation degree of the specific battery to be obtained when a recovering process is performed on the specific battery.

4. The battery degradation authentication device according to claim 1, wherein the authentication mark is formed such that expiring date information indicative of an expiring date of the battery information is acquirable from the authentication mark.

5. The battery degradation authentication device according to claim 4, wherein:
   the server acquires history information indicative of a usage history of the battery; and
   the expiring date information is calculated based on the specification information and the history information.

6. The battery degradation authentication device according to claim 1, wherein:
   the authentication mark includes an adhesive layer; and
   the authentication mark is configured to be attachable to an attachment target object.

7. A battery degradation authentication system comprising:
   a vehicle including a battery;
   a server communicable with the vehicle and including degradation information indicative of a degradation degree of the battery,
   wherein the server calculates the degradation information of the battery based on data that is continuously transmitted to the server from the vehicle including the battery, the data including a travel history of the vehicle and properties of the battery;
   a battery degradation authentication device communicable with the server and configured to output an authentication mark based on which the calculated degradation information of a specific battery specified by a user is acquirable; and
   an acquisition device configured to acquire the degradation information of the specific battery based on the authentication mark.

* * * * *